(12) United States Patent
Bao et al.

(10) Patent No.: US 10,847,507 B2
(45) Date of Patent: Nov. 24, 2020

(54) CONTACT LINER TO ENABLE DIFFERENT CPP DEVICES

(71) Applicant: QUALCOMM Incorporated, San Diego, CA (US)

(72) Inventors: Junjing Bao, San Diego, CA (US); Stanley Song, San Diego, CA (US); Jie Deng, San Diego, CA (US); Giridhar Nallapati, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/001,813

(22) Filed: Jun. 6, 2018

(65) Prior Publication Data

US 2019/0378830 A1 Dec. 12, 2019

(51) Int. Cl.
*H01L 27/02* (2006.01)
*H01L 21/8234* (2006.01)

(52) U.S. Cl.
CPC .. *H01L 27/0207* (2013.01); *H01L 21/823468* (2013.01); *H01L 21/823475* (2013.01)

(58) Field of Classification Search
CPC ..... H01L 21/823475; H01L 21/823468; H01L 27/0207
See application file for complete search history.

(56) References Cited

U.S. PATENT DOCUMENTS 7,176,137 B2   2/2007 Perng et al.
2008/0296637 A1*  12/2008 Shin ................ H01L 21/823425
257/288

* cited by examiner

*Primary Examiner* — Errol V Fernandes
(74) *Attorney, Agent, or Firm* — Withrow & Terranova, PLLC

(57) ABSTRACT

An apparatus includes at least one first device having a first contacted poly pitch (CPP) and a first contact. The first contact has a first contact size. The apparatus also includes at least one second device having a second CPP, a second contact, and a contact liner. The second CPP is larger than the first CPP. The second contact size is constrained by the contact liner, such that the contact liner reduces a contact opening for the second contact.

10 Claims, 7 Drawing Sheets

US 10,847,507 B2

CONTACT LINER TO ENABLE DIFFERENT CPP DEVICES

BACKGROUND

Field

Aspects of the present disclosure relate to semiconductor devices, and more particularly to forming semiconductor devices having different contacted poly pitches (CPP) on a semiconductor wafer die.

Background

Contacted poly pitch (CPP) is a key transistor metric that measures a transistor gate pitch. As semiconductor fabrication technology advances, a greater number and type of transistor devices are provided on a single die to achieve integrated functioning among various devices. For advanced technology nodes beyond 7 nanometers (nm), there is a need to enable devices having different contacted poly pitches (CPPs). Standard cell designers may use anchor devices with a small CPP (for example, 54 nm) to save area on the die, while customer designers may integrate devices with a large CPP (for example, 60 nm) for higher performance on the same die.

Simulation and silicon results have shown that a large CPP device that has a larger contact size than a small CPP device has a lower contact resistance (Rcsd) than the small CPP device, but the gate-to-contact capacitance (Ceff) of the two different CPP devices is approximately the same. Performance of the large CPP device, however, does not improve with a larger contact size, since at advanced technology nodes beyond 7 nm, gate-to-contact capacitance has a greater impact than contact resistance on alternating current (AC) performance. Simulations indicate that a large CPP device would have approximately a 4% performance gain if the contact size remains the same as that of a small CPP device, because the contact resistance would be the same, but the gate-to-contact capacitance of the large CPP device would be smaller.

One approach to enable different CPP devices on a single die includes forming transistor gate structures with different spacer thicknesses—one spacer thickness for small CPP devices, and a thicker spacer for large CPP devices. This technique may lead to damage to the low-k dielectric spacer when the spacer is etched for thickness reduction. As a result, the gate-to-contact capacitance of the large CPP device remains high, which adversely impacts AC performance.

Another approach includes using a self-aligned contact process for a small CPP device, and a non-self-aligned contact process for a large CPP device. This is a more complex process for advanced technology nodes and will require costly EUV or 193i masks.

SUMMARY

An apparatus may include at least one first device having a first contacted poly pitch (CPP) and a first contact. The first contact has a first contact size. The apparatus may also include at least one second device having a second CPP, a second contact having a second contact size constrained by a contact liner. The second CPP is larger than the first CPP.

A method for fabricating a plurality of devices on a die may include providing a substrate having a first region and a second region. The first region includes a plurality of first gates for a first device having a first contacted poly pitch (CPP), while the second region includes a plurality of second gates for a second device having a second CPP. The second CPP is larger than the first CPP. The method also includes etching a first contact opening in the first region of the substrate and a second contact opening in the second region of the substrate. The second contact opening is larger than the first contact opening. The method includes depositing a low-k dielectric material in each of the first contact opening and the second contact opening, and then removing the low-k dielectric material from the first contact opening and the bottom of the second contact opening. A portion of the low-k dielectric material remains on a sidewall of the second contact opening and forms a contact liner in the second contact opening. The method further includes depositing a metal in the first contact opening and the second contact opening to create a first contact for the first device and a second contact for the second device.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form to avoid obscuring such concepts. As described herein, the use of the term "and/or" is intended to represent an "inclusive OR", and the use of the term "or" is intended to represent an "exclusive OR".

One aspect of the present disclosure is a simple and effective way to provide multiple devices having different CPPs on the same die without adversely impacting the AC performance of the larger CPP devices. At advanced technology nodes, in which devices are ever shrinking in size, decreasing the gate-to-contact capacitance (Ceff) of a large CPP device will have a greater impact on AC performance than reducing the contact resistance (Rcsd). The use of a contact liner in the large CPP device reduces the Ceff of the large CPP device while maintaining a Rcsd that is comparable to a small CPP device. In addition, the process described below is cost-effective, since it does not require the use of expensive process masks.

Figure 1:
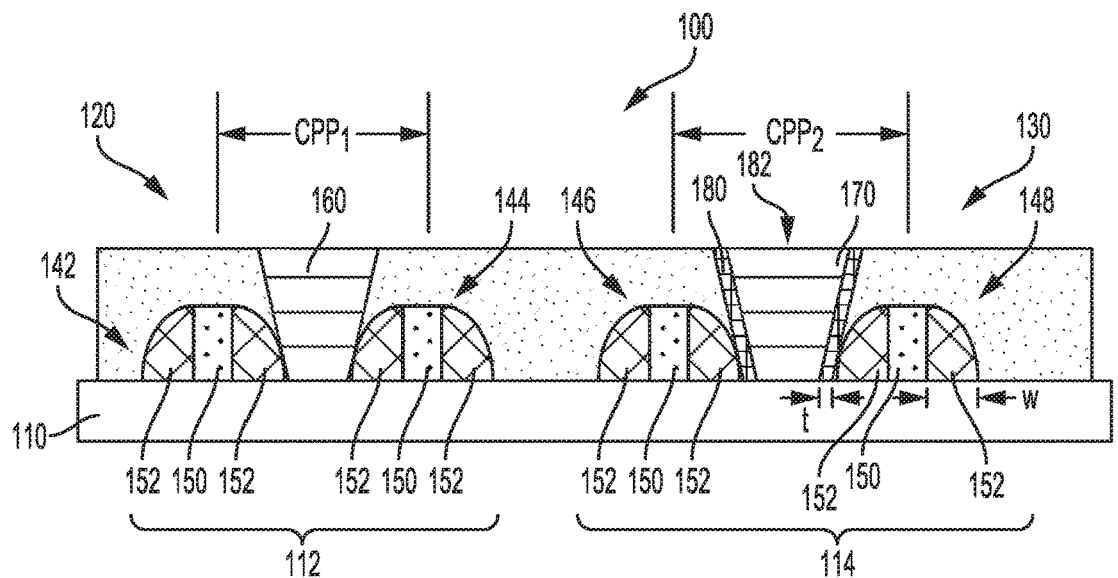
FIG. 1 illustrates a cross-sectional view of a semiconductor device in accordance with one or more aspects of the present disclosure.

FIG. 1 illustrates a cross-sectional view of a semiconductor device. The semiconductor device may be a semiconductor die 100 including a substrate 110 having a first region 112 and a second region 114. The first region 112 of the substrate 100 may include a first device 120, while the second region 114 may include a second device 130.

Each of the first device 120 and the second device 130 may include a plurality of transistors 142, 144, 146 and 148. Each transistor 142, 144, 146 and 148 includes a gate 150 and a pair of gate sidewall spacers 152 that are formed adjacent to the gate 150. The first device 120 may have a contact 160 disposed between the gate sidewall spacers 152 of two adjacent transistors 142 and 144 in the first region 112 of the substrate 110. Similarly, the second device 130 may have a contact 170 disposed between the gate sidewall spacers 152 of two adjacent transistors 146 and 148 in the second region 114 of the substrate 110.

The first device 120 in the first region 112 of the substrate 110 may be an anchor device typically provided by standard cell designers. Examples of such anchor devices may include high density cells, such as level shifters. These devices are typically lower performance devices that have a small footprint and take up less space on the semiconductor die. The first device 120 may have a first contacted poly pitch $CPP_1$.

The second device 130 in the second region 114 of the substrate 110 may be a custom, high performance device with a larger contacted poly pitch $CPP_2$. Examples of such high performance devices may include high performance cells, such as multi-bits flop trays. The CPP of the second device 130, $CPP_2$, may be larger than that of the first device 120. For example, $CPP_2$, may be 60 nm, while the first CPP, $CPP_1$, may be 54 nm.

Even though the CPP of the second device 130 is larger than that of the first device 120, the contact 160 of the first device 120 may have substantially the same area and size as the contact 170 of the second device 130. The second device 130 may include a contact liner 180 in a contact opening 182 between the gate sidewall spacers 152 of adjacent transistors 146 and 148. The contact liner 180 reduces the contact opening 182 for the contact 170, thereby enabling the contact 170 to be similar in area and size as the contact 160 of the first device 120.

The contact liner 180 may be comprised of a low-k dielectric material. For example, low-k dielectric materials suitable for the contact liner 180 may include SiN, SiCN and SiBCN. The contact liner 180 may preferably have a thickness t that is equal to one-half of the difference between the second CPP and the first CPP, or $(CPP_2-CPP_1)/2$. By way of example, if the first CPP, $CPP_1$, is 54 nm and the second CPP, $CPP_2$, is 60 nn, then the thickness t of the contact liner 180 is preferably 3 nm.

The contact liner 180 may reduce the gate-to-contact capacitance (Ceff) of the second, large CPP, device 130. Since the contact 160 of the first device 120 is the same size as the contact 170 of the second device 130, the two devices have substantially the same contact resistance (Rcsd). However, because the gate-to-contact capacitance of the second, large CPP, device 130 is reduced, the second device 130 will experience greater AC performance gain than if it had a larger contact 170, since reducing gate-to-contact capacitance has a greater effect on AC performance than reducing contact resistance.

Another benefit of using contact liner 180 in the second, large CPP, device 130 is that it enables a self-aligned contact process to be employed for both the first, small CPP, device 120 and the second, large CPP, device 130. Without the contact liner, a separate, non-self-aligned contact process would be required for the second, larger CPP, device. Because a single, self-aligned contact process is used for both the first device 120 and the second device 130, the gate sidewall spacers 152 of the transistors 142 and 144 of the first device 120 may have a width equal to that of the gate sidewall spacers 152 of the transistors 146 and 148 of the second device 130.

FIGS. 2A-2I illustrate a process to fabricate a semiconductor device in accordance with one or more aspects of the disclosure. For illustrative purposes, the labelling and numbering of the devices of FIGS. 2A-2I are similar to those of FIG. 1.

Figure 2A:
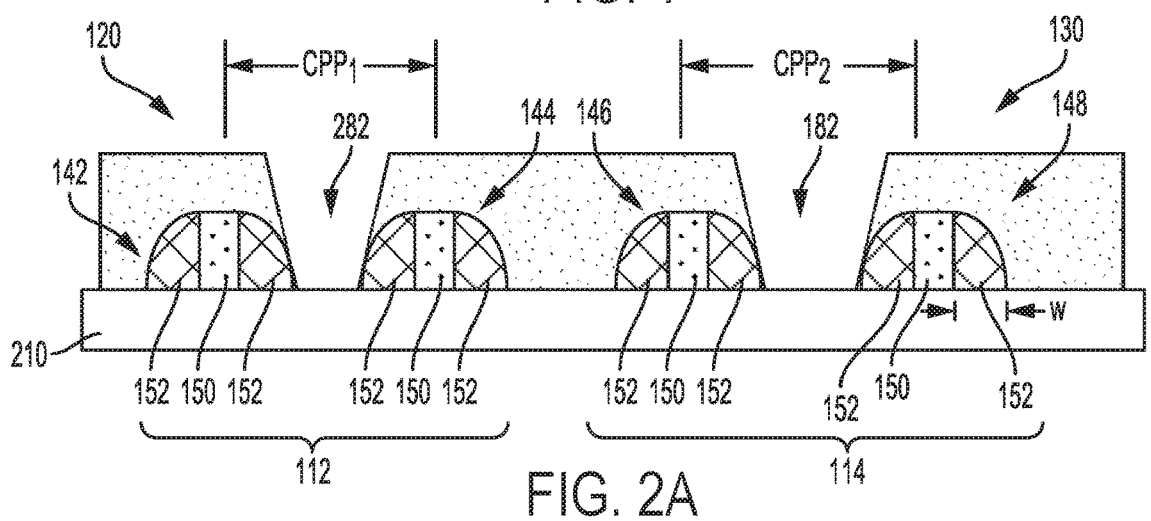
FIGS. 2A-2I illustrate a process to fabricate a semiconductor device in accordance with one or more aspects of the present disclosure.

FIG. 2A illustrates a portion of a wafer substrate 210. The substrate 210 includes a first region 112 for a small CPP device 120 and a second region 114 for a large CPP device 130. The first region 112 of the substrate 210 includes transistors 142 and 144 that have a first CPP, $CPP_1$. The second region 114 of the substrate 210 includes transistors 146 and 148 that have a second CPP, $CPP_2$. The second CPP, $CPP_2$, is larger than the first CPP, $CPP_1$. Each of the transistors 142, 144, 146 and 148 is shown having a gate 150 and a pair of gate sidewall spacers 152. The gate sidewall spacers 152 each have a width w, such that the width of the gate sidewall spacers in the first region 112 are the same as those of the gate sidewall spacers in the second region 114.

The portion of the wafer substrate 210 shown in FIG. 2A is after a self-aligned contact lithography and etch. Contact openings 282 and 182 are formed in the respective first region 112 and second region 114 of the substrate 210. The contact opening 282 is smaller than the contact opening 182 due to the larger CPP of the second device 130 in the second region 114.

Figure 2B:
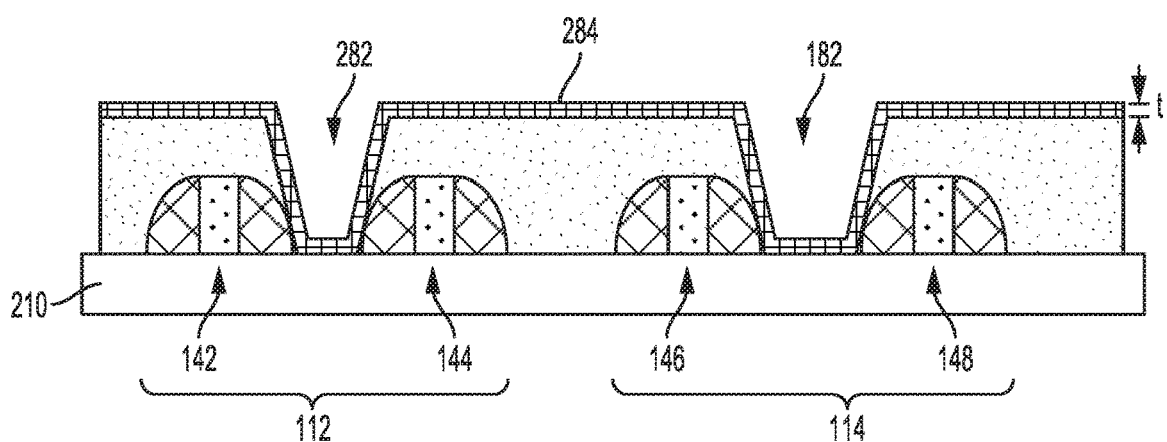

FIG. 2B illustrates the conformal deposition of a contact liner material 284 to a preferred thickness t. The contact liner material 284 may be comprised of a low-k dielectric material, such as SiN, SiCN, or SiBCN. The preferred thickness t of the contact liner material may be equal to one half of the difference between the second CPP, $CPP_2$, and the first CPP, $CPP_1$. By way of example, if $CPP_1$ is 54 nm, and $CPP_2$ is 60 nm, then a 3 nm thick layer of the contact liner material 284 is preferably deposited.

Figure 2C:
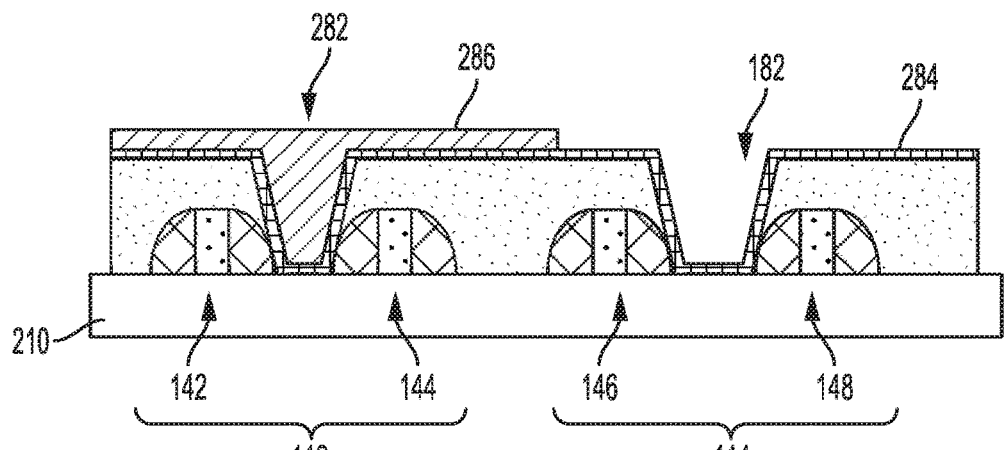

FIG. 2C shows the deposition of a photoresist 286 and application of a deep ultra violet (DUV) block mask to expose the second region 114 of the substrate 210. The first region 112, including the contact opening 282, are covered with the photoresist 286.

Figure 2D:
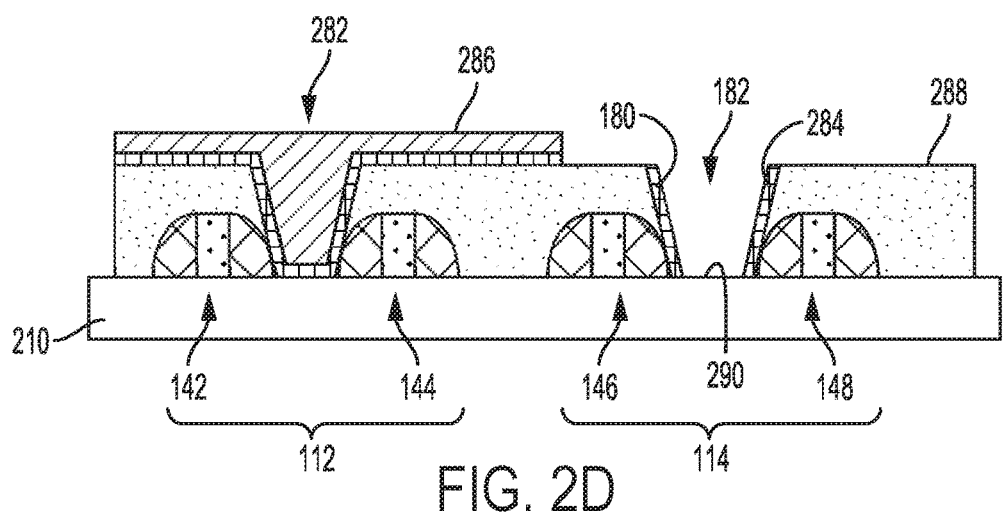

FIG. 2D illustrates the portion of the wafer substrate 210 after an anisotropic etch has removed the contact liner 284 material from an upper surface 288 of the second region 114 and a bottom 290 of the contact opening 182. Because an anisotropic etch was used, a portion of the contact liner material 284 remains on the sidewall of the contact opening 182. This remaining contact liner material 284 in the contact opening 182 forms the contact liner 180.

Figure 2E:
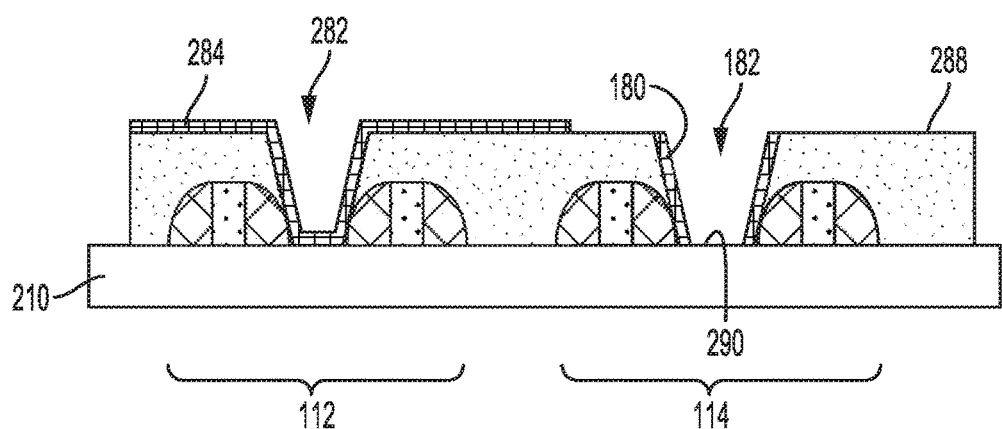

FIG. 2E illustrates the portion of the wafer substrate 210 after an ash and clean have removed the photoresist 286 from the first region 112 of the substrate 210. As a result of the ash and clean, the contact liner material 284 that was deposited in the first region 114 is now exposed.

Figure 2F:
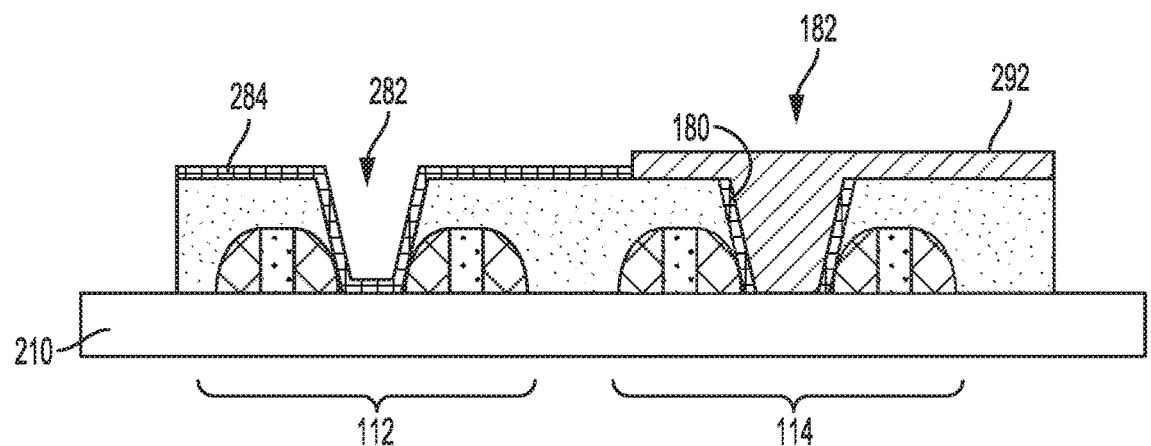

In FIG. 2F shows the deposition of another photoresist 292 is and application of a DUV block mask to expose the first region 112 of the substrate. The second region 114, including the contact opening 182 and the contact liner 180, are covered with the photoresist 292.

Figure 2G:
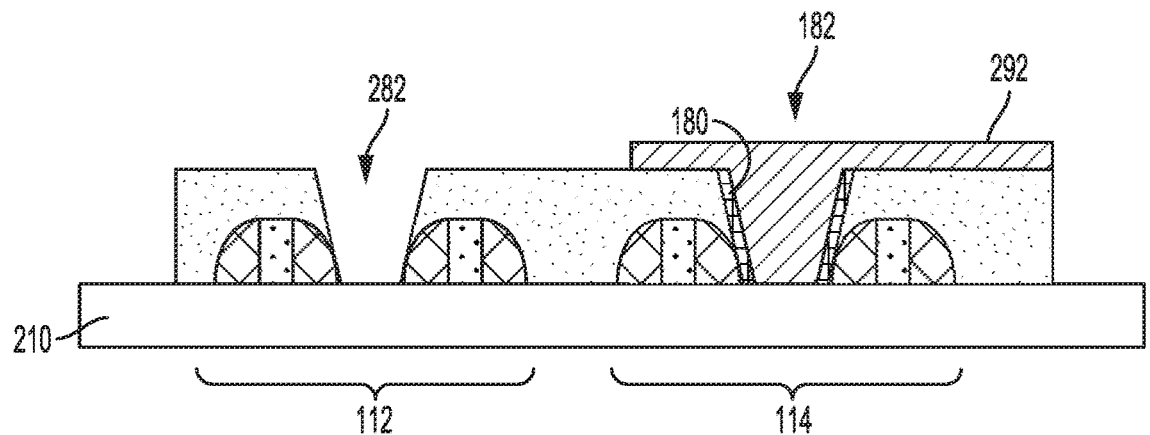

FIG. 2G illustrates the portion of the wafer substrate 210 after an isotropic etch has removed the contact liner material 284 from the first region 112 of the substrate 210. Because an isotropic etch was used, all of the contact liner material 284 in the first region 112, including from the sidewall of the contact opening 282, is removed.

Figure 2H:
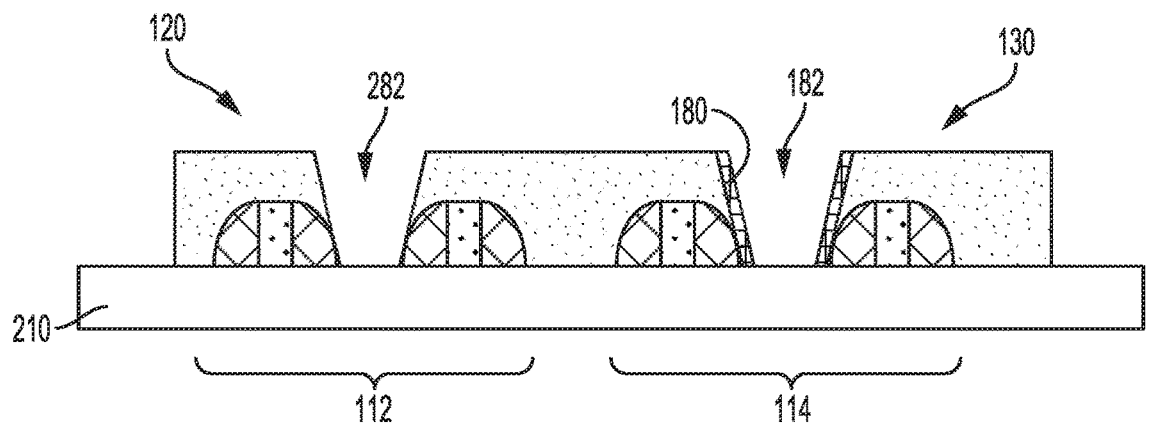

FIG. 2H illustrates the portion of the wafer substrate 210 after an ash and clean have removed the photoresist 292 from the second region 114 of the substrate 210. Both the contact opening 282 in the first region 114 of the substrate 210 and the contact opening 182 in the second region 114 of the substrate 210 are exposed.

Figure 2I:
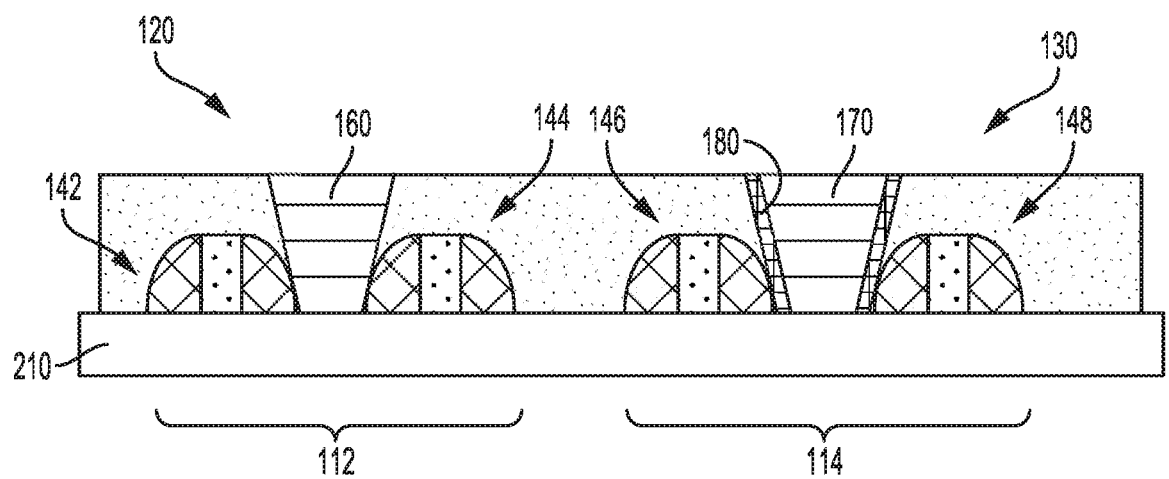

FIG. 2I illustrates the portion of the wafer substrate 210 after a barrier metal (not shown) has been deposited in the contact openings 282 and 182, then filled with a contact metal and chemically mechanically polished to form a contact 160 of a first, small CPP, device 120 in the first region 112 of the substrate 210 and a contact 170 of a second, large CPP, device 130 in the second region 114 of the substrate 210. The barrier metal may be comprised of titanium or titanium nitride, while the contact metal may be any suitable metal, such as cobalt or tungsten.

As discussed noted above, the presence of the contact liner 180 in the contact opening 182 in the second region 114 of the substrate 210 enables the contact 170 of the second, large CPP, device 130 to have a similar size and area as the contact 160 in the contact opening 282 in the first region 112 of the substrate 210. This may improve the AC performance of the large CPP device 130, because its gate-to-contact capacitance will be lower than for a similar, large CPP device that has a larger contact size but lacks the contact liner 180.

Figure 3:
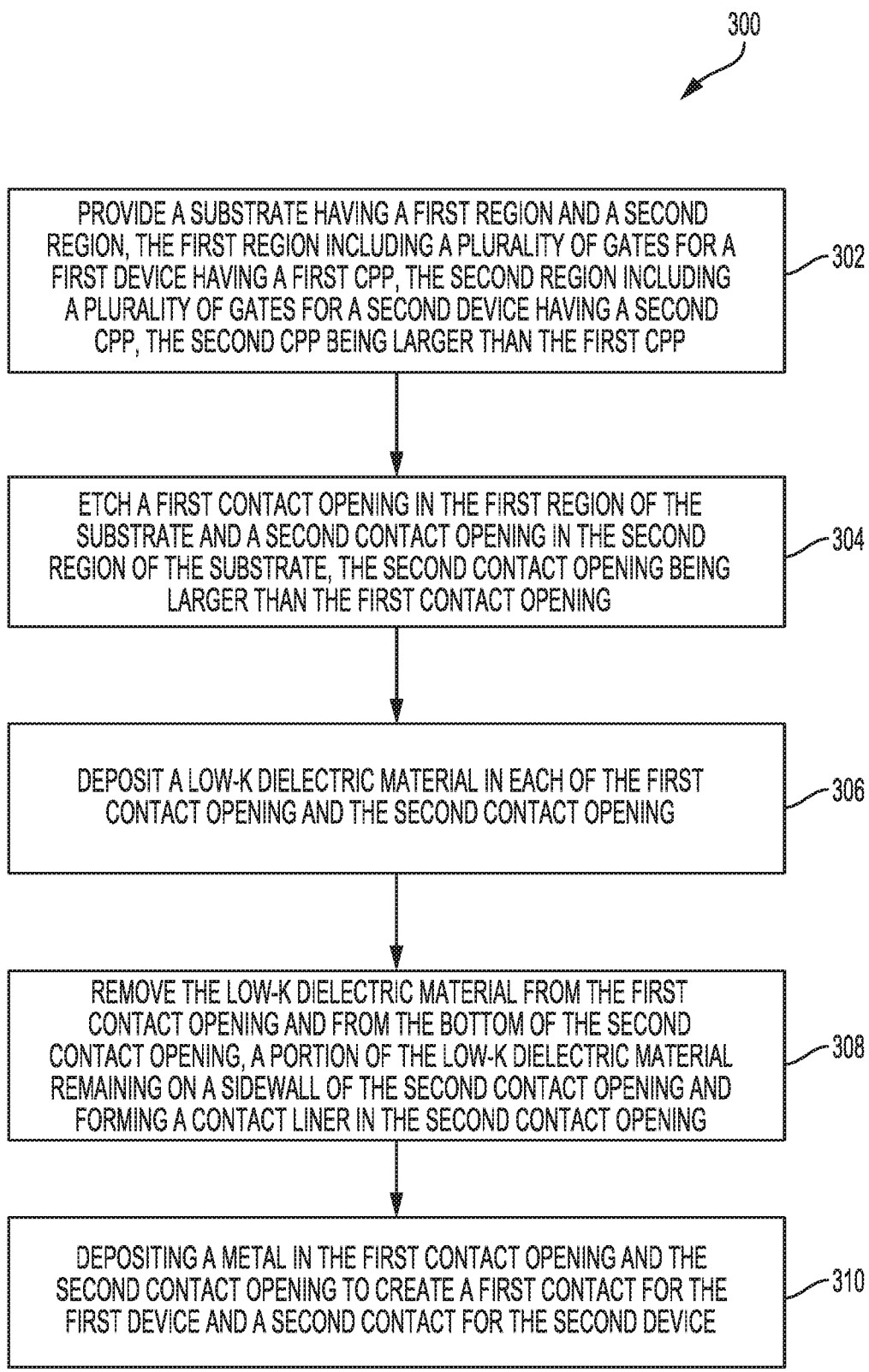
FIG. 3 is a process flow diagram illustrating a method for fabricating a device according to an aspect of the present disclosure.

FIG. 3 is a process flow diagram illustrating a method 300 for fabricating a device according to an aspect of the present disclosure. In block 302, a wafer substrate is provided with a first region and a second region. The first region including a plurality of gates for transistors for a first device having a first CPP, and the second region including a plurality of gates for transistors for a second device having a second CPP. The second CPP is larger than the first CPP. Each transistor of the first device and the second device includes a gate.

In block 304, a first contact opening is etched in the first region of the substrate and a second contact opening is etched in the second region of the substrate, as shown in FIG. 2A. Because the second contact opening 182 is located in the second region 114 of the substrate 210, reserved for the larger CPP device, the second contact opening 182 is larger than the first contact opening 282.

In block 306, a low-k dielectric material is deposited on the substrate 210 in each of the first contact opening 282 and the second contact opening 182, as shown in FIG. 2B. The low-k dielectric material is preferably deposited to a desired thickness that is equal to one half the difference between the second CPP and the first CPP.

In block 308, the low-k dielectric material is removed from the first contact opening 282 and from the bottom of the second contact opening 182, as shown in FIGS. 2C-2H. As shown in FIG. 2H, the low-k dielectric material that remains is the contact liner 180 in the second contact opening 182 to reduce the size of the second contact opening 182 similar to that of the first contact opening 282.

In block 310, metal is deposited in the first contact opening 282 and the second contact opening 182 to create a first contact 160 for the first device 120 and a second contact 170 for the second device 130, as shown in FIG. 2. If the contacts 160 and 170 are composed of cobalt or tungsten, a barrier metal (not shown) may first be deposited in the contact opening 282 and 182.

Figure 4:
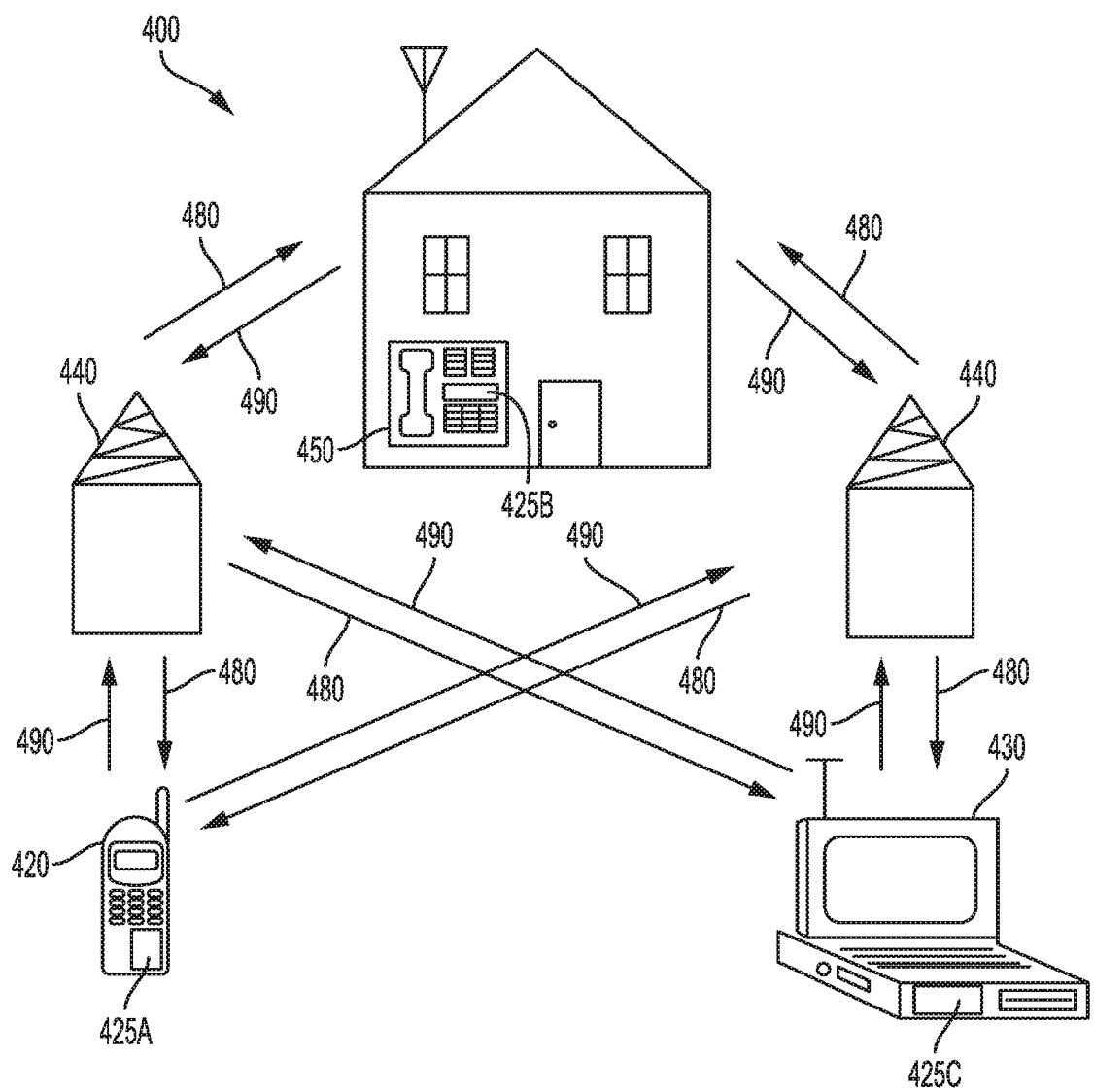
FIG. 4 is a block diagram showing an exemplary wireless communication system in which an aspect of the disclosure may be advantageously employed.

FIG. 4 is a block diagram showing an exemplary wireless communication system 400 in which an aspect of the disclosure may be advantageously employed. For purposes of illustration, FIG. 4 shows three remote units 420, 430, and 450 and two base stations 440. It will be recognized that wireless communication systems may have many more remote units and base stations. Remote units 420, 430, and 450 include IC devices 425A, 425C, and 425B that include the disclosed devices. It will be recognized that other devices may also include the disclosed devices, such as the base stations, switching devices, and network equipment. FIG. 4 shows forward link signals 480 from the base station 440 to the remote units 420, 430, and 450 and reverse link signals 490 from the remote units 420, 430, and 450 to base stations 440.

In FIG. 4, remote unit 420 is shown as a mobile telephone, remote unit 430 is shown as a portable computer, and remote unit 450 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 4 illustrates remote units according to the aspects of the disclosure, the disclosure is not limited to these exemplary illustrated units. Aspects of the disclosure may be suitably employed in many devices, which include the disclosed devices.

Figure 5:
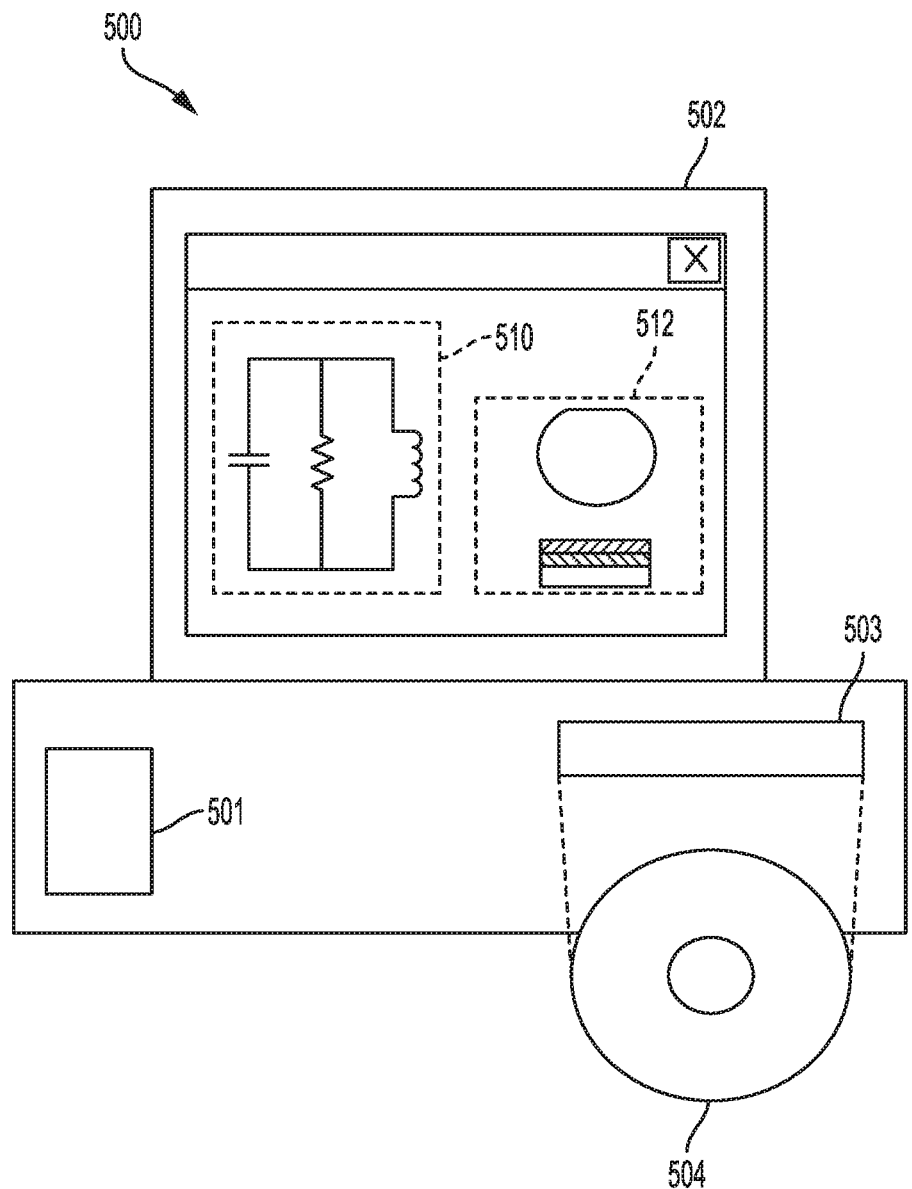
FIG. 5 is a block diagram illustrating a design workstation used for circuit, layout, and logic design of a semiconductor component in accordance with an aspect of the present disclosure.

FIG. 5 is a block diagram illustrating a design workstation used for circuit, layout, and logic design of a semiconductor component, such as the devices disclosed above. A design workstation 500 includes a hard disk 501 containing operating system software, support files, and design software such as Cadence or OrCAD. The design workstation 500 also includes a display 502 to facilitate design of a circuit 510 or a semiconductor component 512 such as a device in accordance with an aspect of the present disclosure. A storage medium 504 is provided for tangibly storing the design of the circuit 510 or the semiconductor component 512. The design of the circuit 510 or the semiconductor component 512 may be stored on the storage medium 504 in a file format such as GDSII or GERBER. The storage medium 504 may be a CD-ROM, DVD, hard disk, flash memory, or other appropriate device. Furthermore, the design workstation 500 includes a drive apparatus 503 for accepting input from or writing output to the storage medium 504.

Data recorded on the storage medium 504 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 504 facilitates the design of the circuit 510 or the semiconductor component 512 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An apparatus comprising:
   at least one first device that includes a first plurality of transistors, each transistor of the first plurality of transistors includes a gate with sidewall spacers adjacent to the gate, the at least one first device having a first contacted poly pitch (CPP) and a first contact in a first contact opening between the sidewall spacers of at least two transistor gates of the first plurality of transistors, the first contact having a first contact size; and
   at least one second device that includes a second plurality of transistors, each transistor of the second plurality of transistors includes a gate with sidewall spacers adjacent to the gate, the at least one second device having a second CPP, a second contact opening between the sidewall spacers of at least two transistor gates of the second plurality of transistors, the second contact opening having sidewalls, a contact liner adjacent to the sidewalls of the second contact opening, a second contact in the second contact opening, the second contact having a second contact size, the second contact size constrained by the contact liner between the second contact and the sidewalls of the second contact opening;
   wherein the second CPP is larger than the first CPP.

2. The apparatus of claim 1, wherein the sidewall spacers of the first plurality of transistors have a first width, and the sidewall spacers of the second plurality of transistors have a second width, the first width being substantially equal to the second width.

3. The apparatus of claim 1, wherein the first contact size is substantially equal to the second contact size.

4. The apparatus of claim 1, wherein the contact liner has a thickness substantially equal to one-half of a difference between a length of the second CPP and a length of the first CPP.

5. The apparatus of claim 4, wherein the thickness of the contact liner is at least 3 nm.

6. The apparatus of claim 1, wherein the contact liner is comprised of a low-k dielectric material.

7. The apparatus of claim 6, wherein the low-k dielectric material is selected from the group consisting of SiN, SiCN and SiBCN.

8. The apparatus of claim 1, integrated into a mobile phone, a set top box, a music player, a video player, an entertainment unit, a navigation device, a computer, a hand-held personal communication system (PCS), a portable data unit, and/or a fixed location data unit.

9. A semiconductor die comprising:
   a first plurality of transistors, each transistor of the first plurality of transistors includes a gate with sidewall spacers adjacent to the gate, the first plurality of transistors having a first contacted poly pitch (CPP), a first contact opening between the sidewall spacers of at least two transistor gates of the first plurality of transistors, the first contact opening having a first contact opening size; and
   a second plurality of transistors, each transistor of the second plurality of transistors includes a gate with sidewall spacers adjacent to the gate, the second plurality of transistors having a second CPP that is larger than the first CPP, a second contact opening between the sidewall spacers of at least two transistor gates of the second plurality of transistors, the second contact opening having sidewalls, a contact liner adjacent to the sidewalls of the second contact opening, a second contact in the second contact opening, the second contact opening having a second contact opening size, the second contact opening size reduced by the contact liner between the second contact and the sidewalls of the second contact opening.

10. The semiconductor die of claim 9, wherein the second contact opening size is substantially equal to the first contact opening size.

* * * * *